(12) United States Patent
Kubota

(10) Patent No.: US 10,249,859 B2
(45) Date of Patent: Apr. 2, 2019

(54) BATTERY BUILT-IN BOARD AND METHOD FOR MANUFACTURING THE SAME

(71) Applicant: SHINKO ELECTRIC INDUSTRIES CO., LTD., Nagano-shi, Nagano (JP)

(72) Inventor: Kazuyuki Kubota, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 580 days.

(21) Appl. No.: 14/685,664

(22) Filed: Apr. 14, 2015

(65) Prior Publication Data
US 2015/0303424 A1 Oct. 22, 2015

(30) Foreign Application Priority Data
Apr. 16, 2014 (JP) .................................. 2014-084551

(51) Int. Cl.
*H01M 2/10* (2006.01)
*H01M 2/02* (2006.01)
(Continued)

(52) U.S. Cl.
CPC .......... *H01M 2/1094* (2013.01); *H01L 23/58* (2013.01); *H01L 24/19* (2013.01); *H01L 25/105* (2013.01); *H01M 2/0207* (2013.01); *H01M 2/202* (2013.01); *H01M 6/40* (2013.01); *H01M 10/0436* (2013.01); *H05K 1/185* (2013.01); *C25D 7/123* (2013.01); *H01L 2224/04105* (2013.01); *H01L 2224/12105* (2013.01); *H01L 2224/16227* (2013.01); *H01L 2224/73267* (2013.01); *H01L 2224/8203* (2013.01); *H01L 2224/92244* (2013.01); *H01L 2224/94* (2013.01); *H01L 2225/1023* (2013.01);
(Continued)

(58) Field of Classification Search
CPC ............. H01M 2/1072; H01M 2/0207; H01M 2/0245; H01M 2/0267; H01M 2/1061; H01M 10/052; H01M 10/0585
USPC ......................................................... 429/121
See application file for complete search history.

(56) References Cited

U.S. PATENT DOCUMENTS

| 2008/0032236 A1* | 2/2008 | Wallace .................. H01M 6/40 430/319 |
| 2008/0138701 A1 | 6/2008 | Kuboki et al. |

(Continued)

FOREIGN PATENT DOCUMENTS

| JP | 2001-217337 | 8/2001 |
| JP | 2008-147391 | 6/2008 |

(Continued)

OTHER PUBLICATIONS http://www.dupont.com/content/dam/dupont/products-and-services/membranes-and-films/polyimde-films/documents/DEC-Kapton-summary-of-properties.pdf accessed May 8, 2017.*

(Continued)

*Primary Examiner* — Cynthia H Kelly
*Assistant Examiner* — Rashid A Alam
(74) *Attorney, Agent, or Firm* — Rankin, Hill & Clark LLP

(57) ABSTRACT

A battery built-in board includes a battery component comprising a battery and an insulation part covering the battery, a first insulation layer in which the battery component is placed, and a second insulation layer formed on the first insulation layer and covering the battery component. Rigidity of the insulation part is lower than that of the first insulation layer and the second insulation layer.

14 Claims, 12 Drawing Sheets

(51) Int. Cl.
*H01M 2/20* (2006.01)
*H01M 10/04* (2006.01)
*H01M 6/40* (2006.01)
*H05K 1/18* (2006.01)
*H01L 23/58* (2006.01)
*H01L 23/00* (2006.01)
*H01L 25/10* (2006.01)
*H01M 10/052* (2010.01)
*H01M 10/0562* (2010.01)
*H01M 10/0585* (2010.01)
*H01M 10/42* (2006.01)
*H05K 3/46* (2006.01)
*C25D 7/12* (2006.01)

(52) U.S. Cl.
CPC .......... *H01L 2225/1035* (2013.01); *H01L 2225/1058* (2013.01); *H01L 2924/15311* (2013.01); *H01L 2924/15331* (2013.01); *H01M 10/052* (2013.01); *H01M 10/0562* (2013.01); *H01M 10/0585* (2013.01); *H01M 10/425* (2013.01); *H05K 3/4661* (2013.01); *H05K 2201/10037* (2013.01)

(56) References Cited

U.S. PATENT DOCUMENTS

| | | | |
|---|---|---|---|
| 2009/0214899 A1* | 8/2009 | Shakespeare | H01M 2/0426 429/7 |
| 2009/0284230 A1* | 11/2009 | Goma | H01M 10/46 320/152 |
| 2010/0213597 A1 | 8/2010 | Sugino et al. | |
| 2011/0052979 A1* | 3/2011 | Bouillon | H01M 2/1061 429/185 |
| 2011/0183183 A1 | 7/2011 | Grady et al. | |
| 2014/0209366 A1 | 7/2014 | Kubota et al. | |
| 2015/0200418 A1 | 7/2015 | Grady et al. | |

FOREIGN PATENT DOCUMENTS

| | | | |
|---|---|---|---|
| JP | 2013-518394 | 5/2013 | |
| JP | 2014-150103 | 8/2014 | |
| WO | 2009/051120 | 4/2009 | |
| WO | WO 2014062676 A1 * | 4/2014 | H01M 10/0585 |

OTHER PUBLICATIONS

Japanese Office Action dated Oct. 31, 2017, English translation included, 6 pages.

\* cited by examiner

BATTERY BUILT-IN BOARD AND METHOD FOR MANUFACTURING THE SAME

CROSS-REFERENCE TO RELATED APPLICATION

The present application claims priority from Japanese Patent Application No. 2014-084551 filed on Apr. 16, 2014, the entire content of which is incorporated herein by reference.

BACKGROUND

Technical Field

The present disclosure relates to a battery built-in board and a method for manufacturing the battery built-in board.

Related Art

There is a wiring board in which an electronic component such as a semiconductor chip is incorporated. In this wiring board, the electronic component is mounted on a wiring member and an insulation layer is formed thereon, so that the electronic component is embedded in the insulation layer.

After that, a via hole is formed in the insulation layer. The via hole reaches a connection electrode of the electronic component. A wiring layer is formed on the insulation layer. The wiring layer is connected to the connection electrode through the via hole.

PRIOR ART LITERATURE

Patent Document

Patent Document 1: Japanese Patent Laid-Open Publication No. 2001-217337

When using a secondary battery as an electronic component, the secondary battery has a characteristic that volume is varied by charging and discharging. Therefore, in the case where the secondary battery is embedded in an insulation layer of a wiring board, such as an epoxy resin with a relatively high rigidity, the stress due to volume change of the secondary battery cannot be released. Accordingly, the secondary battery may be damaged.

SUMMARY

Exemplary embodiments of the invention provide a battery built-in board having a secondary battery incorporated therein and a method for manufacturing the battery built-in board, which is capable of improving reliability.

A battery built-in board, according to an exemplary embodiment, comprises:

a battery component comprising a battery and an insulation part covering the battery; and an insulation layer covering the battery component, wherein rigidity of the insulation part is lower than that of the insulation layer.

A method for manufacturing a battery built-in board, according to an exemplary embodiment, comprises:

preparing a battery component comprising a battery and an insulation part covering the battery;

placing the battery component on a first insulation layer in a state where the insulation part faces upward; and forming a second insulation layer covering the battery component on the first insulation layer, wherein rigidity of the insulation part is lower than that of the first insulation layer and the second insulation layer.

According to the following disclosure, a battery component where an insulation part is formed on a battery is incorporated in a battery built-in board. The insulation part of the battery component is formed from a low rigid insulation layer. The low rigid insulation layer has rigidity lower than that of an insulation layer where the battery component is embedded.

In this way, the stress due to volume change of the battery component is released, so that damage to the battery component can be prevented. Further, the battery component that is previously covered by the insulation part can be mounted on a wiring member, so that it is possible to improve production efficiency.

DETAILED DESCRIPTION

Hereinafter, an exemplary embodiment will be described with reference to the accompanying drawings.

Figure 1:
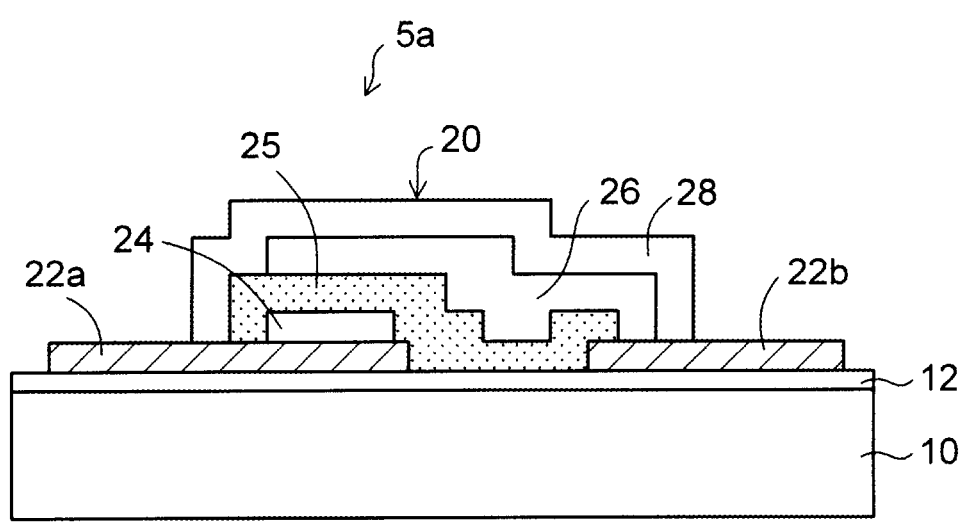
FIG. 1 is a sectional view showing a secondary battery to be incorporated in a battery built-in board according to an exemplary embodiment.
Figure 2A:
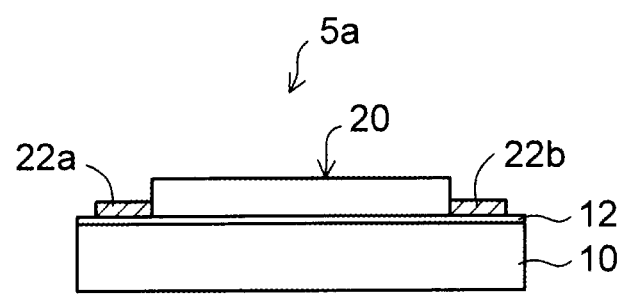
FIG. 2A is a sectional view schematically showing the secondary battery of FIG. 1

FIG. 1 and FIG. 2A are sectional views showing a secondary battery to be incorporated in a battery built-in board according to an exemplary embodiment. FIG. 3A to FIG. 9C are sectional views showing a manufacturing method of the battery built-in board according to the exemplary embodiment. FIG. 10 is a view showing the battery built-in board according to the exemplary embodiment.

Hereinafter, a structure of a battery built-in board will be described while explaining a manufacturing method of the battery built-in board.

First, a secondary battery to be incorporated in the battery built-in board according to the exemplary embodiment will be described. As shown in FIG. 1, a secondary battery 5a includes a substrate 10 and a battery body 20. An insulation layer 12 is formed on an upper surface of the substrate 10. The battery body 20 is disposed on the insulation layer 12 formed on the substrate 10.

In FIG. 1, the substrate 10 is formed from a silicon substrate and the insulation layer 12 is formed from a silicon nitride layer (SiN) or a silicon oxide layer ($SiO_2$). Alternatively, the substrate 10 may be formed from an insulation substrate such as a glass substrate. When the substrate 10 is formed from the insulation substrate, the insulation layer 12 is omitted.

The battery body 20 includes a plus (+) electrode 22a and a minus (−) electrode 22b, which are arranged on the insulation layer 12 formed on the substrate 10. Further, the battery body 20 includes a cathode 24, an electrolyte layer 25 and an anode 26 in order from the below on the plus electrode 22a. The cathode 24 is connected to one end side of the plus electrode 22a. The other end side of the plus electrode 22a is exposed to constitute a connection portion.

The electrolyte layer 25 and the anode 26 extend to one end of the minus electrode 22b. The anode 26 is connected to one end side of the minus electrode 22b. The other end side of the minus electrode 22b is exposed to constitute a connection portion.

Further, the cathode 24, the electrolyte layer 25 and the anode 26 are covered by a protective layer 28.

The plus electrode 22a and the minus electrode 22b are formed from, for example, aluminum or aluminum alloy. The surfaces of the plus electrode 22a and the minus electrode 22b are subjected to a nickel plating process.

The thickness of the substrate 10 including the insulation layer 12 is approximately 150 μm and the thickness of the battery body 20 is approximately 25 μm.

The secondary battery 5a is an all-solid thin film secondary battery. For example, there is a lithium-ion battery using LiPON (Lithium Phosphate OxyNitride) as the electrolyte layer 25. In the lithium-ion battery; during the discharge, lithium molecule becomes lithium ion by sending an electron to the anode 26. The lithium ion moves to the cathode 24 through the electrolyte layer 25 and is stored as a lithium compound in the cathode 24.

On the contrary, during the charge, the lithium compound in the cathode 24 is separated and the lithium ion reaches the anode 26 through the electrolyte layer 25. The lithium ion becomes the lithium molecule by receiving an electron and is stored in the anode 26.

In the secondary battery 5a, the volume of the electrolyte layer 25 is increased during the charge. Further, the volume of the electrolyte layer 25 is decreased during the discharge. In this way, the secondary battery 5a has a characteristic that the volume is increased or decreased during using. Therefore, in the case where the secondary battery 5a is embedded in an insulation layer of a wiring board, such as an epoxy resin with a relatively high rigidity, the stress due to volume change of the secondary battery 5a cannot be released. Accordingly, the secondary battery 5a may be damaged.

Therefore, in the present embodiment, the secondary battery 5a is covered by an insulation part made of a low rigid insulation layer. Here, the low rigid insulation layer has rigidity lower than a general interlayer insulation material such as an epoxy resin. By doing so, the stress due to volume change of the secondary battery 5a can be released.

In the present embodiment, the secondary battery is used as the battery; however, the primary battery can be used instead of the secondary battery. The volume of the primary battery is also increased and decreased due to the heat. Therefore, the similar effect can be obtained.

Hereinafter, a method of forming the insulation part (low rigid insulation part) on the secondary battery 5a will be described.

FIG. 2A is a reduced view schematically showing the battery body 20 of the secondary battery 5a of FIG. 1. In FIG. 2A, the inside of the battery body 20 is omitted and each connection portion of the plus electrode 22a and the minus electrode 22b is shown.

Figure 2B:
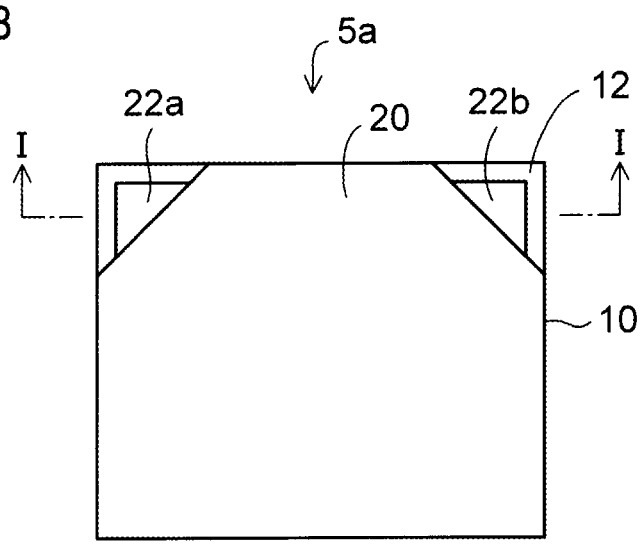
FIG. 2B is a plan view of the secondary battery of FIG. 2A, as seen from the above.

Further, FIG. 2B is a plan view of the secondary battery 5a of FIG. 2A, as seen from the above. FIG. 2A corresponds to a sectional view taken along a line I-I of FIG. 2B.

In the following description, a description is made with reference to the secondary battery 5a shown in FIG. 2A.

Figure 3A:
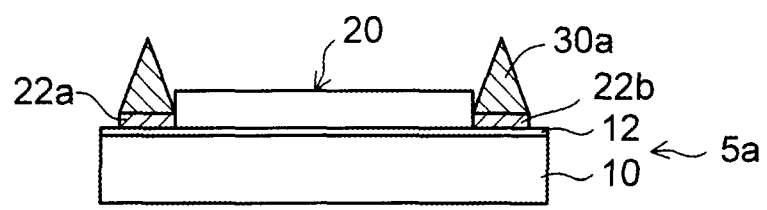
FIGS. 3A to 3C are sectional views showing a first process for forming an insulation part on the secondary battery according to the exemplary embodiment.

First, a first process of covering the secondary battery by the insulation part (low rigid insulation part) will be described. As shown in FIG. 3A, first, gold bumps 30a are formed using a gold wire, by a wire bonding process, at each connection portion of the plus electrode 22a and the minus electrode 22b of the secondary battery 5a while the secondary battery 5a is heated at a temperature of about 150° C.

The protruding height of the gold bumps 30a from the upper surface of the secondary battery 5a is set, for example, to 30 to 50 μm. In addition to the gold bumps 30a, metal bumps made of other metals, such as copper bump, may be formed by a wire bonding process or the like.

Figure 3B:
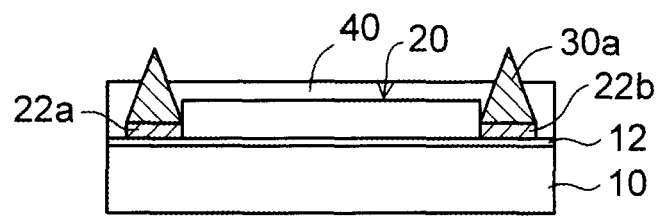

Next, as shown in FIG. 3B, an insulation part 40 is formed on the secondary battery 5a formed with the gold bumps 30a. The insulation part 40 has a characteristic that rigidity thereof is lower than a general insulation layer used as an interlayer insulation material of the wiring board.

The resin used as the interlayer insulation material of the wiring board can include epoxy resin, polyimide resin or phenol resin or the like.

Meanwhile, as the insulation part 40, the resin with rubber elasticity is properly used. As the insulation part 40, silicone resin such as silicone elastomer or silicone gel is properly used. In addition to the silicone resin, urethane resin or polyolefin resin or the like may be used.

The insulation part 40 is formed by coating a liquid-phase silicone resin on the secondary battery 5a using a spin coat process or a potting process and then heating and curing the silicone resin coated.

The insulation part 40 is formed in a thickness of about 5 to 25 μm on the secondary battery 5a. A leading end side of the gold bump 30a is exposed by being protruded from the insulation part 40.

Rigidity of the resin refers to a degree of difficulty in deformation and can be compared by a tensile strength. The resin with a low tensile strength means that the resin has a low rigidity. The tensile strength of epoxy resin used as a general interlayer insulation material of the wiring board is 70 MPa to 100 MPa. On the other hand, the tensile strength of the silicone resin used as the insulation part 40 is 0.5 MPa to 10 MPa. Here, the tensile strength is based on ISO 527-1 (Plastics—Determination of tensile properties—Part 1: General principles).

In this way, the value of the tensile strength of the insulation part 40 (silicone resin) is considerably lower than that of the tensile strength of the epoxy resin. Accordingly, it is understood that the rigidity of the insulation part 40 (silicone resin) is considerably low.

In FIG. 3B, the insulation part 40 is formed in a state where a framework is disposed around the secondary battery 5a. By doing so, the side surface of the insulation part 40 is flush with the side surface of the substrate 10 of the secondary battery 5*a*. Alternatively, the insulation part 40 may flow into the side surface of the substrate 10 of the secondary battery 5*a* to cover the side surface thereof.

Figure 3C:
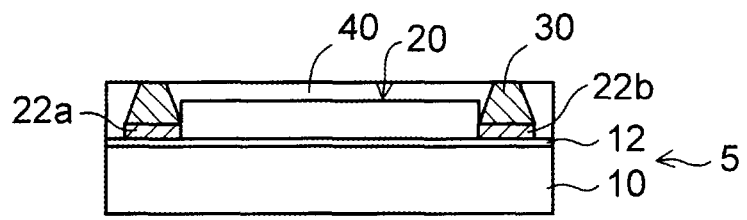

Subsequently, as shown in FIG. 3C, the structure of FIG. 3B is sandwiched and pressed by a lower mold and an upper mold, so that a protruding portion on the leading end side of the gold bump 30*a* is squashed and removed. This processing is also referred to as a coining process. In this way, the upper surface of the gold bump 30*a* and the upper surface of the insulation part 40 are flush with each other and flattened.

Alternatively, the protruding portion on the leading end side of the gold bump 30*a* may be cut by a surface planer, so that the upper surface of the gold bump 30*a* and the upper surface of the insulation part 40 may be flush with each other and flattened.

In this way, a secondary battery component 5 is obtained. The secondary battery component 5 has a structure where an upper surface side is covered by the insulation part 40 and a connection electrode 30 formed from the gold bump 30*a* is exposed from the insulation part 40. The upper surface of the connection electrode 30 is exposed in a state where a side surface thereof is embedded in the insulation part 40.

Next, a second process of covering the secondary battery by the insulation part (low rigid insulation part) will be described. In the above-described embodiment, a process of forming the insulation part 40 on each individual secondary battery 5*a* is described. In the second process, the insulation part is formed on a silicon wafer where a plurality of battery bodies is arranged side by side.

Figure 4A:
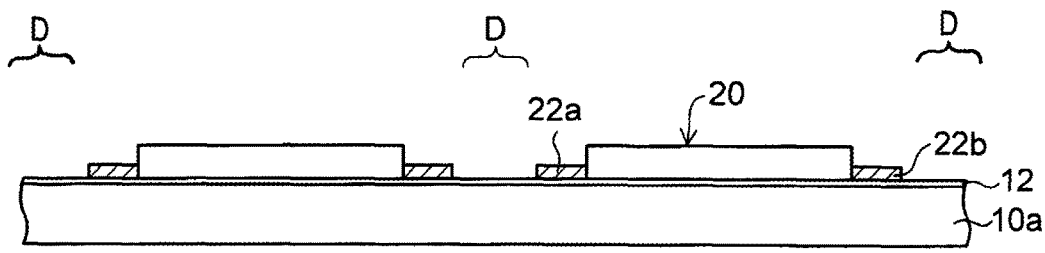
FIGS. 4A to 4E are sectional views showing a second process for forming the insulation part on the secondary battery according to the exemplary embodiment.

More specifically, first, as shown in FIG. 4A, a silicon wafer 10*a* is prepared where the insulation layer 12 is formed on the upper surface and a plurality of battery bodies 20 is arranged side by side in a transverse direction thereon. Dicing regions D are defined at peripheral regions surrounding each battery body 20.

Figure 4B:
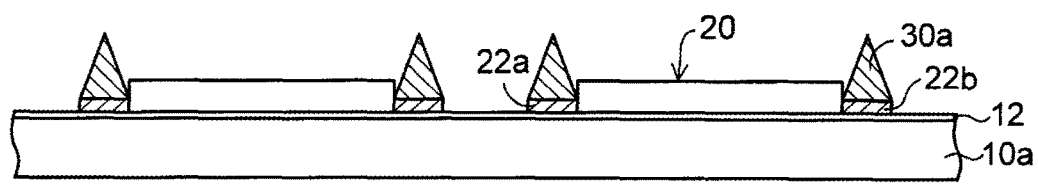

Next, as shown in FIG. 4B, by the same method as the above-described process of FIG. 3A, the gold bump 30*a* is formed on a connection portion of the plus electrode 22*a* and the minus electrode 22*b* of the battery body 20.

Figure 4C:
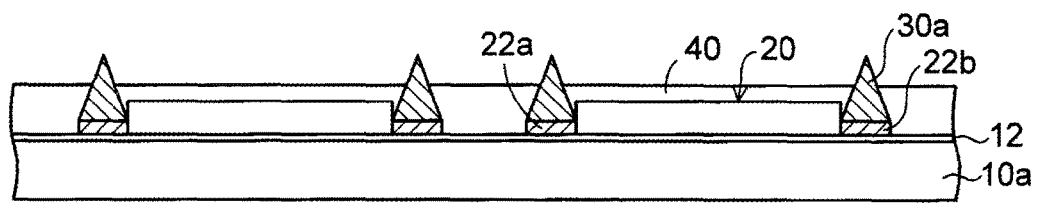

Subsequently, as shown in FIG. 4C, by the same method as the above-described process of FIG. 3B, the insulation part 40 is formed on the whole surface of the silicon wafer 10*a* so that each battery body 20 is covered and a leading end side of the gold bump 30*a* is protruded and exposed.

Figure 4D:
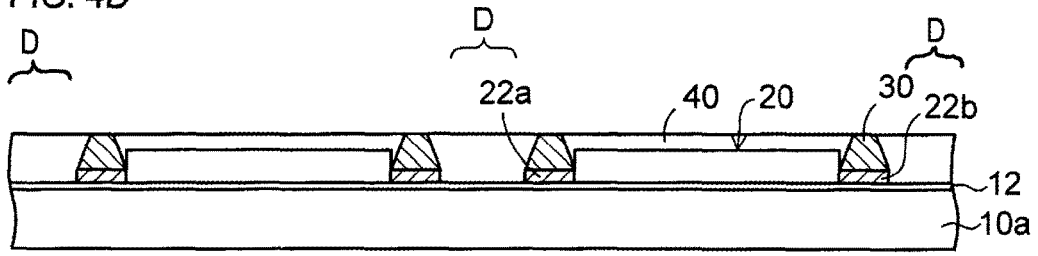

Further, as shown in FIG. 4D, by the same method as the above-described process of FIG. 3C, a protruding portion exposed on the leading end side of the gold bump 30*a* is removed, so that the upper surface of the gold bump 30*a* and the upper surface of the insulation part 40 are flush with each other and flattened.

In this way, the connection electrode 30 is formed from the gold bump 30*a*. The connection electrode 30 is formed in such a way that an upper surface is exposed in a state where a side surface is embedded in the insulation part 40.

Figure 4E:
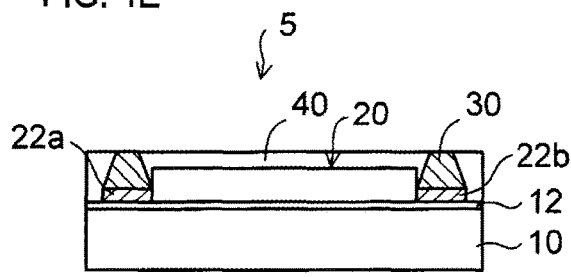

Thereafter, as shown in FIGS. 4D and 4E, at the dicing regions D of the silicon wafer 10*a*, portions from the upper surface of the insulation part 40 to the lower surface of the silicon wafer 10*a* are cut by a rotation blade of a cutting device. The silicon wafer 10*a* is divided to obtain individual substrate 10.

In this way, as shown in FIG. 4E, the secondary battery component 5 having the same structure as in FIG. 3C described above is obtained. Instead of the silicon wafer 10*a*, a wafer made of insulation material such as a glass wafer may be used.

Next, a third process of covering the secondary battery by the insulation part (low rigid insulation part) will be described. In the first and second process described above, the gold bump 30*a* is formed in the secondary battery 5*a* by a wire bonding process. In the third process, a metal bump is formed in the secondary battery by an electrolytic plating process.

Figure 5A:
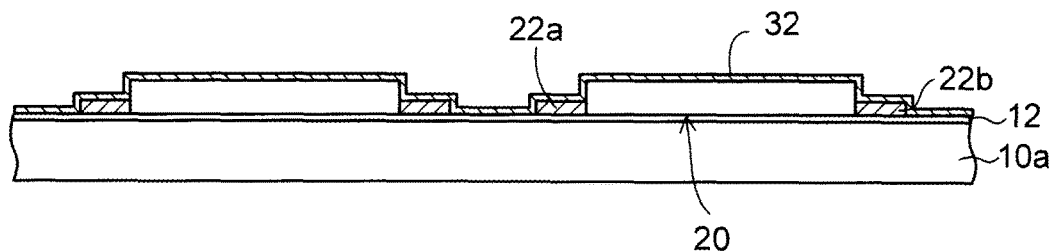
FIGS. 5A to 5D are sectional views (first view) showing a third process for forming the insulation part on the secondary battery according to the exemplary embodiment.

More specifically, as shown in FIG. 5A, the silicon wafer 10*a* is prepared where a plurality of battery bodies 20 is arranged, similarly to FIG. 4A described above. Then, a seed layer 32 made of copper or the like is formed on the battery body 20 and the silicon wafer 10*a* by an electroless plating process or a sputtering process.

Figure 5B:
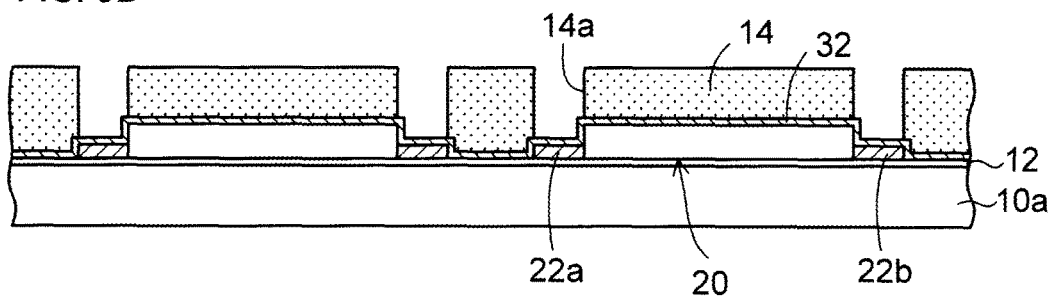

Next, as shown in FIG. 5B, a plating resist layer 14 is formed on the seed layer 32. In the plating resist layer 14, an opening portion 14*a* is provided at a portion where the metal bump is placed.

Figure 5C:
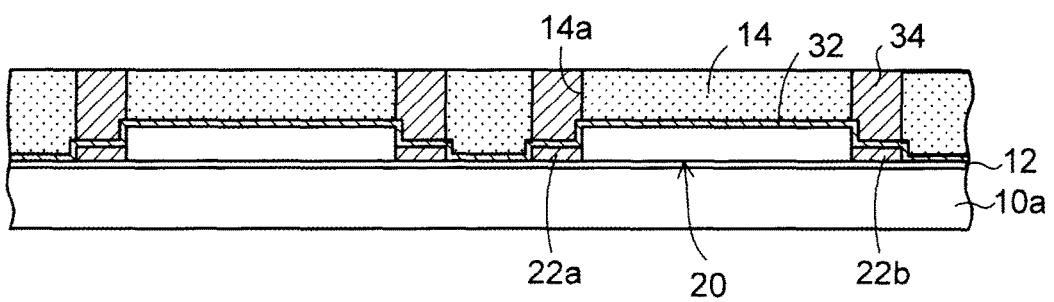
Figure 5D:
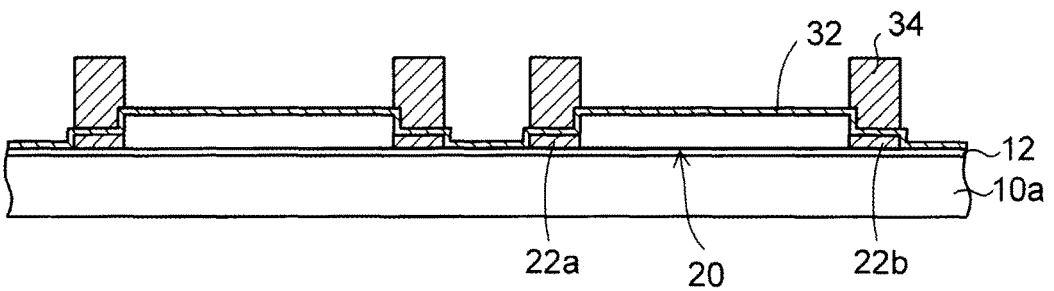

Further, as shown in FIG. 5C, by an electrolytic plating process using the seed layer 32 in a plating power feeding path, a metal plating layer 34 is formed in the opening portion 14*a* of the plating resist layer 14. The metal plating layer 34 is formed of copper, gold or the like. Then, as shown in FIG. 5D, the plating resist layer 14 is removed.

Figure 6A:
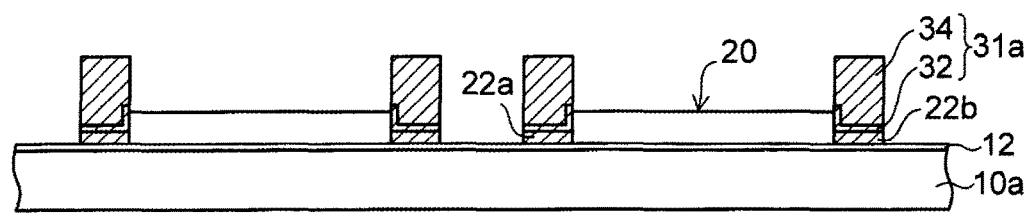
FIGS. 6A to 6D are sectional views (second view) showing the third process for forming the insulation part on the secondary battery according to the exemplary embodiment.

Subsequently, as shown in FIG. 6A, the seed layer 32 is removed by a wet etching process using the metal plating layer 34 as a mask.

In this way, the metal bump 31*a* protruding upward is formed at each connection portion of the plus electrode 22*a* and the minus electrode 22*b* of the battery body 20. The metal bump 31*a* is formed from the seed layer 32 and the metal plating layer 34.

Figure 6B:
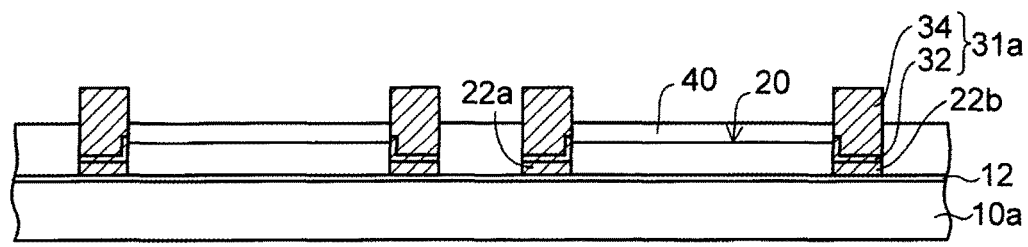

Next, as shown in FIG. 6B, by the same method as the process of FIG. 3B described above, the insulation part 40 is formed on the entire surface of the silicon wafer 10*a* so that each battery body 20 is covered and a leading end side of the metal bump 31*a* is protruded and exposed.

Figure 6C:
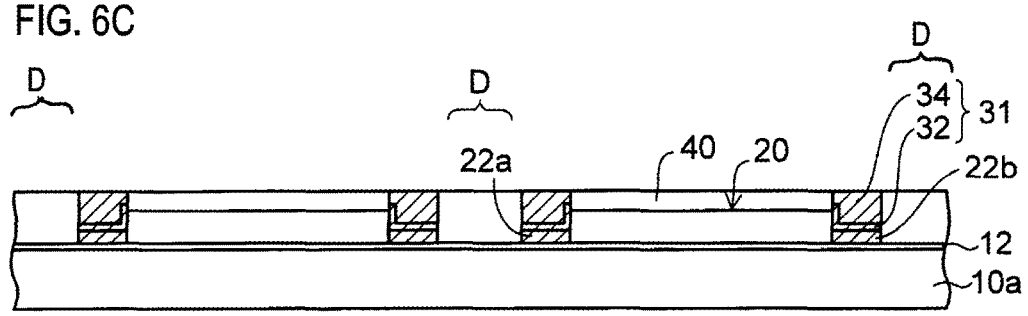

Furthermore, as shown in FIG. 6C, by the same method as the process of FIG. 3C described above, a protruding portion exposed on the leading end side of the metal bump 31*a* is removed, so that the upper surface of the metal bump 31*a* and the upper surface of the insulation part 40 are flush with each other and flattened. In this way, a connection electrode 31 is formed from the metal bump 31*a*. The connection electrode 31 is formed in such a way that an upper surface is exposed in a state where a side surface is embedded in the insulation part 40.

Figure 6D:
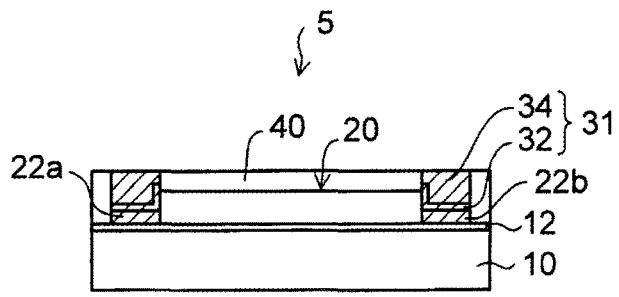

Then, as shown in FIGS. 6C and 6D, at the dicing regions D of the silicon wafer 10*a*, portions from the upper surface of the insulation part 40 to the lower surface of the silicon wafer 10*a* are cut. The silicon wafer 10*a* is divided to obtain individual substrate 10.

In this way, as shown in FIG. 6D, the secondary battery component 5 is obtained. The secondary battery component 5 has a structure where an upper surface side is covered by the insulation part 40 and the connection electrode 31 formed from the metal bump 31*a* is exposed from the insulation part 40.

Instead of the silicon wafer 10*a*, a wafer made of insulation material such as a glass wafer may be used.

Figure 7A:
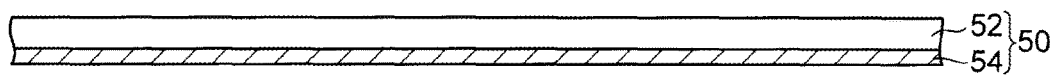
FIGS. 7A to 7D are sectional views (first view) showing a manufacturing method of the battery built-in board according to the exemplary embodiment.

Next, a method of incorporating the secondary battery component 5 having the insulation part 40 of FIG. 3C described above in the wiring board will be described. As shown in FIG. 7A, first, a base material 50 is prepared in which a metal foil 54 is formed on one surface of a first insulation layer 52. For example, the first insulation layer 52 is formed from epoxy resin and the metal foil 54 is formed from copper. The base material 50 is formed by thermally pressing a metal foil on a resin film through an adhesive.

Figure 7B:
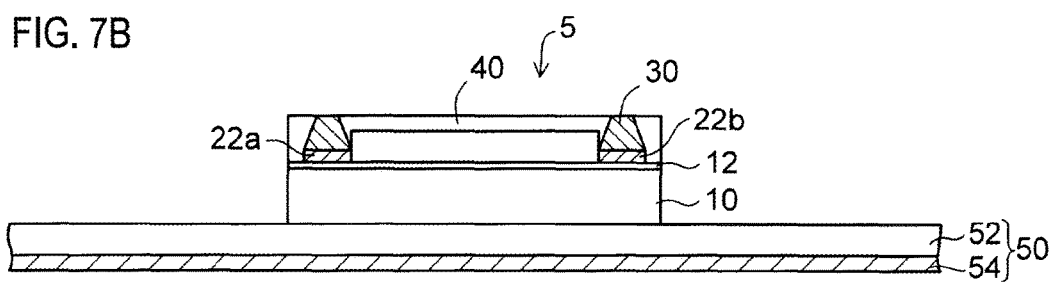

Further, as shown in FIG. 7B, the secondary battery component 5 of FIG. 3C is placed on the exposed surface of the first insulation layer 52 of the base material 50. A back surface of the substrate 10 of the secondary battery component 5 is bonded to the first insulation layer 52 of the base material 50 by an adhesive (not shown) so that the insulation part 40 and the connection electrode 30 of the secondary battery component 5 face upward.

In order to cover the secondary battery by a low rigid insulation layer, resin material different from the general interlayer insulation layer is used. Accordingly, a new facility and a space for installing the facility are required. Therefore, there is a problem that it is difficult to introduce a process of forming the low rigid insulation layer into an existing manufacturing line of the wiring board.

In the present embodiment, the secondary battery 5a is covered by the insulation part 40 in a line different from an existing manufacturing line of the wiring board. Therefore, it is not necessary to newly introduce a process of forming the insulation part 40 to the existing manufacturing line of the wiring board.

Further, since the insulation part 40 can be formed in the secondary battery 5a simultaneously in parallel with the manufacturing of the wiring member, it is possible to shorten the process time.

In this way, the secondary battery 5a in a state of an individual component is covered by the insulation part 40. Accordingly, it is not necessary to add a new process to the existing manufacturing line of the wiring board, so that production efficiency can be improved.

Figure 7C:
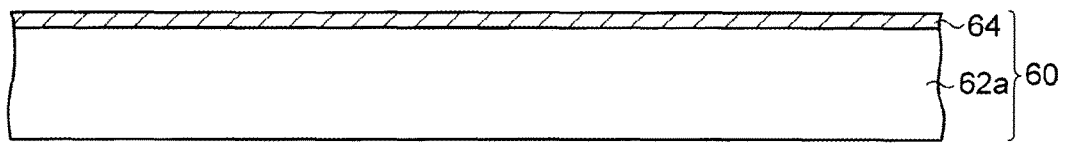

Next, as shown in FIG. 7C, a base material 60 is prepared where a metal foil 64 is formed on one surface of uncured resin film 62a. Then, the resin film 62a of the base material 60 is heated while being pressed toward the secondary battery component 5.

Figure 7D:
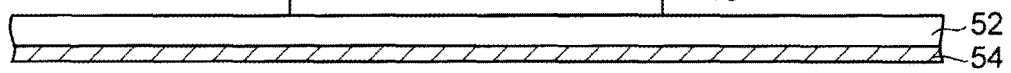

Thereby, as shown in FIG. 7D, the resin film 62a is fluidized and cured so that the secondary battery component 5 is embedded in the resin film 62a. As a result, a second insulation layer 62 is formed on the first insulation layer 52. The second insulation layer 62 covers the secondary battery component 5. The second insulation layer 62 is formed in a state where the metal foil 64 is placed on the upper surface. The secondary battery 5 is embedded in the second insulation layer 62 in a state where the upper surfaces of the second insulation layer 62 and the metal foil 64 are flattened.

In this way, an insulation board 6 is formed by the first insulation layer 52 and the second insulation layer 62 and the secondary battery 5a is embedded in the insulation board 6.

Figure 8A:
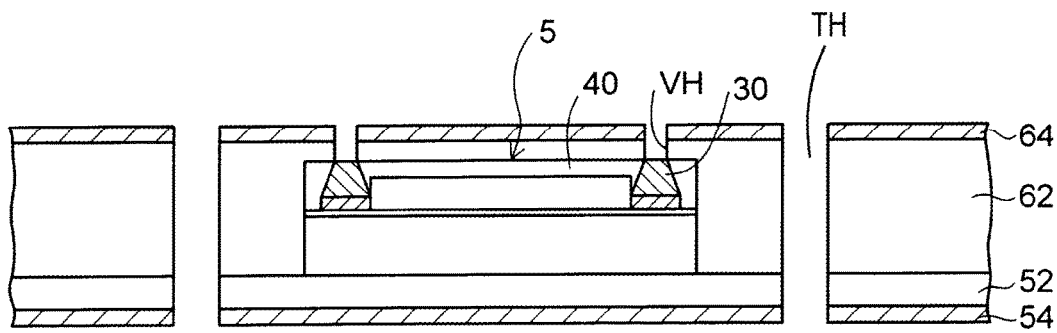
FIGS. 8A and 8B are sectional views (second view) showing the manufacturing method of the battery built-in board according to the exemplary embodiment.

Subsequently, as shown in FIG. 8A, the metal foil 64 and the second insulation layer 62 on the upper surface side are processed, so that a via hole VH is formed. The via hole VH reaches the connection electrode 30 of the secondary battery component 5. The metal foil 64 is removed by a wet etching process and the second insulation layer 62 is removed by a laser.

Further, through holes TH are formed at outer regions on both sides of the secondary battery component 5. The through holes TH are penetrated to the metal foil 54 on the lower side from the metal foil 64 on the upper side. The metal foils 54, 64 on both sides are removed by a wet etching process and the first insulation layer 52 and the second insulation layer 62 are removed by a laser.

Alternatively, instead of removing the metal foils 54, 64 by a wet etching process, the metal foils 54, 64 and the first and second insulation layers 52, 62 may be collectively processed by a laser, so that the via hole VH and the through hole TH may be formed.

Thereafter, the via hole VH and the through hole TH are subjected to a desmear process using potassium permanganate solution or the like. In this way, the resin smear remaining in the via hole VH and the through hole TH is cleaned.

Figure 8B:
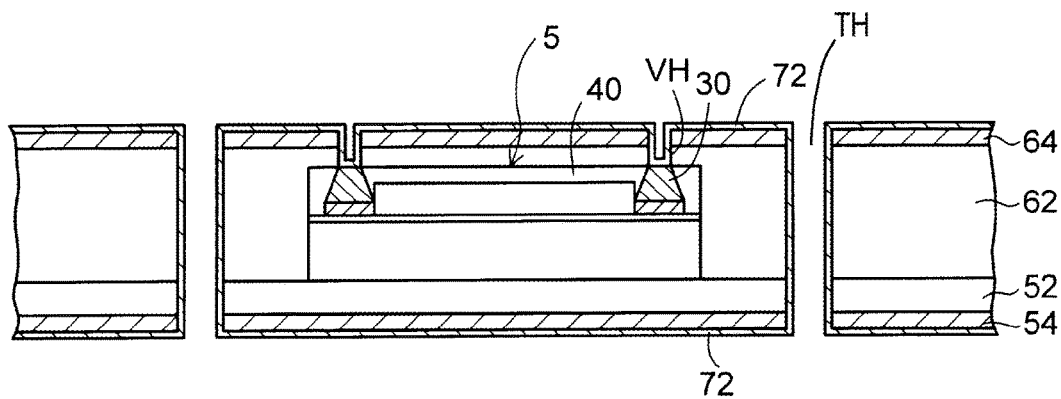

Next, as shown in FIG. 8B, a seed layer 72 made of copper or the like is formed on the metal foils 54, 64 at both sides of the structure of FIG. 8A and on an inner surface of the via hole VH and the through hole TH by using an electroless plating process.

Figure 9A:
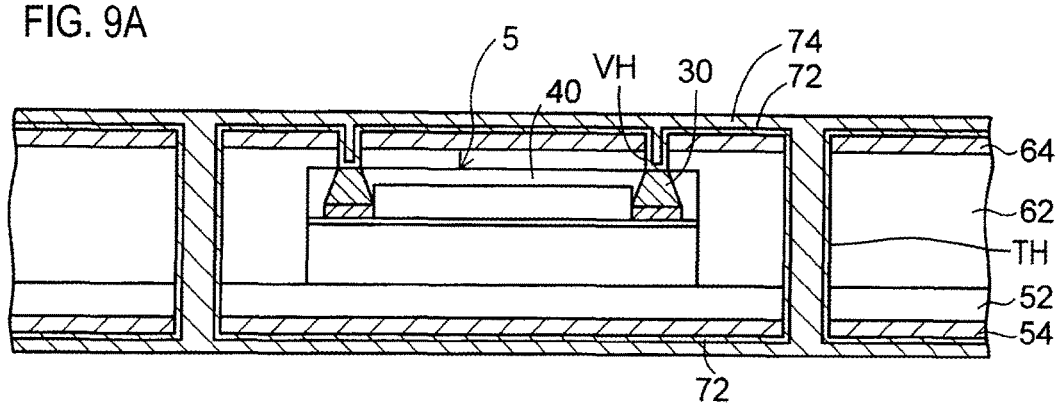
FIGS. 9A to 9C are sectional views (third view) showing the manufacturing method of the battery built-in board according to the exemplary embodiment.
Figure 10:
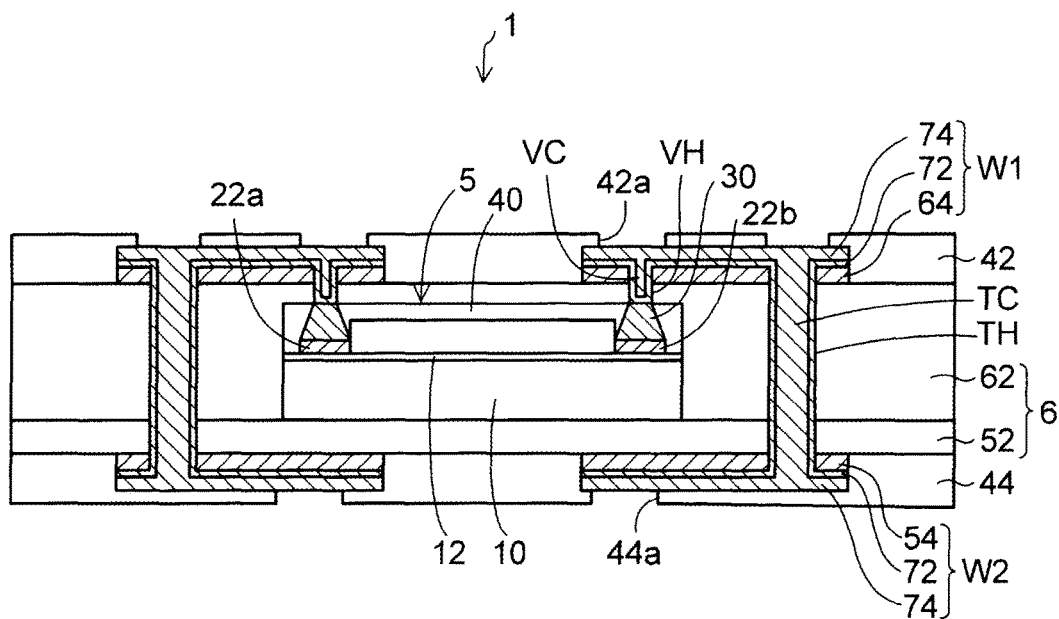
FIG. 10 is a sectional view showing the battery built-in board according to the exemplary embodiment.

Next, as shown in FIG. 9A, by an electrolytic plating process using the seed layer 72 in a plating power feeding path, a metal plating layer 74 made of copper or the like is formed in the via hole VH and the through hole TH and on the metal foils 54, 64 at both sides. The metal plating layer 74 is formed by completely being embedded in the via hole VH and the through hole TH.

Alternatively, the metal plating layer may be formed on the side wall so as not to be completely embedded in the via hole VH and the through hole TH. Further, conductive paste may be filled in the remaining portion of the holes.

Figure 9B:
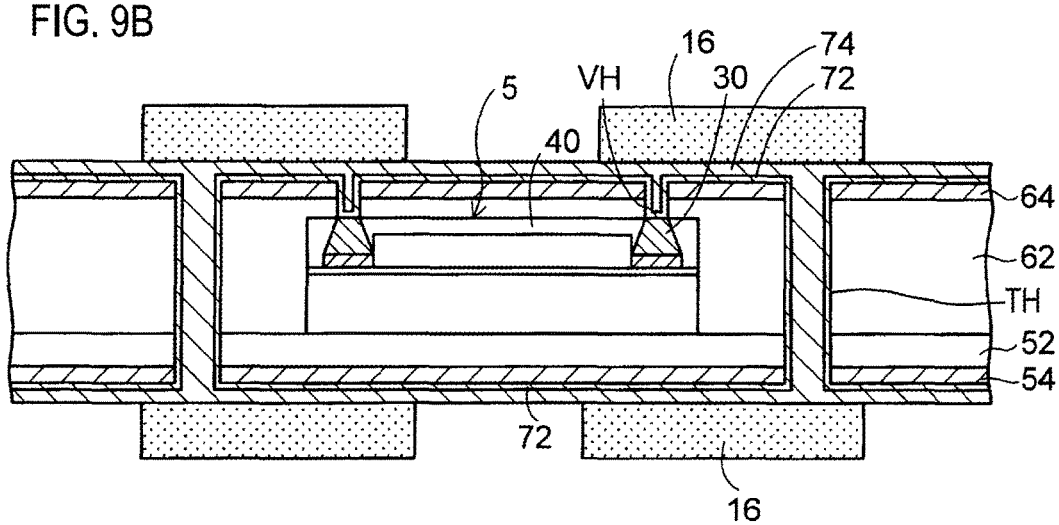

Subsequently, as shown in FIG. 9B, photoresist layers 16 are, respectively, patterned on the metal plating layer 74 at both sides by a photolithography. The photoresist layers 16 correspond to the pattern of the wiring layer.

Further, on the upper surface side of the insulation board 6, the metal plating layer 74, the seed layer 72 and metal foil 64 are patterned by being subjected to a wet etching process using the photoresist layer 16 as a mask. At the same time, on the lower surface side of the insulation board 6, the metal plating layer 74, the seed layer 72 and metal foil 54 are patterned by being subjected to a wet etching process using the photoresist layer 16 as a mask. Then, the photoresist layers 16 are removed.

Figure 9C:
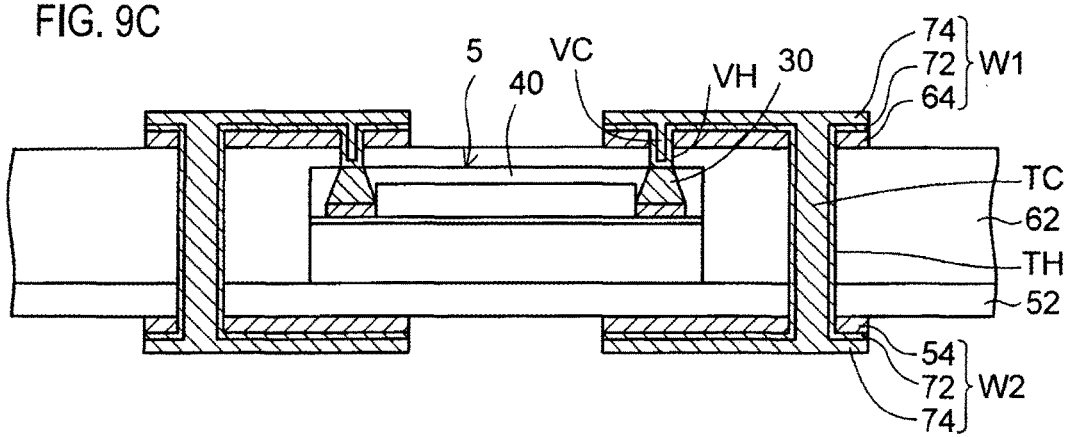

In this way, as shown in FIG. 9C, on the upper surface side of the insulation board 6, a first wiring layer W1 is formed from the metal foil 64, the seed layer 72 and the metal plating layer 74, which are formed in order from the below. The first wiring layer W1 is connected to the connection electrode 30 of the secondary battery component 5 through a via conductor VC in the via hole VH.

Further, on the lower surface side of the insulation board 6, a second wiring layer W2 is formed from the metal foil 54, the seed layer 72 and the metal plating layer 74, which are formed in order from the first insulation layer 52 side. The second wiring layer W2 is connected to the first wiring layer W1 through a through conductor TC filled in the through hole TH.

And then, as shown in FIG. 10, on the upper surface side of the insulation board 6, a solder resist layer 42 is formed on the second insulation layer 62. The solder resist layer 42 is provided with an opening portion 42a on the connection portion of the first wiring layer W1. Similarly, on the lower surface side of the insulation board 6, a solder resist layer 44 is formed on the first insulation layer 52. The solder resist layer 44 is provided with an opening portion 44a on the connection portion of the second wiring layer W2.

Then, when using a multi-chamfered lame board, a wiring member is divided by being cut at dicing regions by a rotation blade of a cutting device, or the like.

With the above, the battery built-in board 1 of the exemplary embodiment is obtained.

As shown in FIG. 10, the battery built-in board 1 of the exemplary embodiment includes the insulation board 6 that is formed from the first insulation layer 52 and the second insulation layer 62 on the first insulation layer 52. The secondary battery component 5 including the insulation part 40 described in FIG. 3C is placed on the first insulation layer 52. Further, the second insulation layer 62 covering the secondary battery component 5 is formed on the first insulation layer 52. The secondary battery component 5 is embedded in the second insulation layer 62 in a state where the insulation part 40 and the connection electrode 30 face upward. In this way, the secondary battery component 5 is embedded between the first insulation layer 52 and the second insulation layer 62.

In the present embodiment, the secondary battery component 5 is placed on the first insulation layer 52. Here, the secondary battery component 5 is previously provided with the insulation part 40. Therefore, only the secondary battery 5a is covered by the insulation part 40. The insulation part 40 is not present in the region outside the secondary battery component 5.

The side surface of the connection electrode 30 of the secondary battery component 5 is embedded in the insulation part 40 and the upper surface of the connection electrode 30 is exposed from the insulation part 40. The upper surface of the connection electrode 30 of the secondary battery component 5 is flush with the upper surface of the insulation part 40. The secondary battery component 5 may be also provided at its side surface with the insulation part 40.

The second insulation layer 62 is formed with the via hole VH. The via hole VH reaches the connection electrode 30 of the secondary battery component 5. Further, the first wiring layer W1 is formed on the second insulation layer 62. The first wiring layer W1 is connected to the connection electrode 30 of the secondary battery component 5 through the via conductor VC in the via hole VH. The first wiring layer W1 is formed from the metal foil 64, the seed layer 72 and the metal plating layer 74.

Further, the second wiring layer W2 is formed on the lower surface of the first insulation layer 52. The second wiring layer W2 is formed from the metal foil 54, the seed layer 72 and the metal plating layer 74.

Further, the through hole TH is formed through the insulation board 6 from the upper surface to the lower surface. The first wiring layer W1 and the second wiring layer W2 are connected to each other through the through conductor TC filled in the through hole TH.

The solder resist layer 42 where the opening portion 42a is provided on the connection portion of the first wiring layer W1 is formed on the upper surface side of the insulation board 6. In the solder resist layer 42. Further, the solder resist layer 44 where the opening portion 44a is provided on the connection portion of the second wiring layer W2 is formed on the lower surface side of the insulation board 6.

In the battery built-in board 1 of the present embodiment, the first insulation layer 52 and the second insulation layer 62 are formed from epoxy resin, polyimide resin, or phenol resin, or the like.

Meanwhile, the insulation part 40 included in the secondary battery component 5 is formed from a low rigid resin. The low rigid resin has rigidity lower than the first insulation layer 52 and the second insulation layer 62. As a suitable example, the insulation part 40 is formed from silicone resin.

Volume of the secondary battery 5a is varied by increase and decrease in volume of the electrolyte layer 25 (FIG. 1) in accordance with the charging and discharging. Unlike the present embodiment, in the case where the secondary battery 5a is covered by an epoxy resin layer or the like with a relatively high rigidity, the stress due to the volume change of the secondary battery 5a cannot be released. Accordingly, stress is applied to the secondary battery 5a and therefore damage is likely to occur in the secondary battery 5a.

However, in the present embodiment, the secondary battery component 5 is provided with the insulation part 40 with low rigidity. Accordingly, the stress can be released in the insulation part 40 when the volume of the secondary battery component 5 is varied.

Accordingly, the stress due to the volume change is hardly applied to the secondary battery component 5, so that damage to the secondary battery component 5 is prevented. In this way, it is possible to improve reliability of the battery built-in board 1 where the secondary battery component 5 is incorporated.

Further, as explained in the above-described manufacturing method, the insulation part 40 included in the secondary battery component 5 is formed not in an existing manufacturing line for the wiring board but in a separate manufacturing line. Therefore, the secondary battery component 5 previously provided with the insulation part 40 can be carried to the existing manufacturing line for the wiring board and mounted on the wiring member. As a result, it is possible to improve productivity efficiency.

Figure 11:
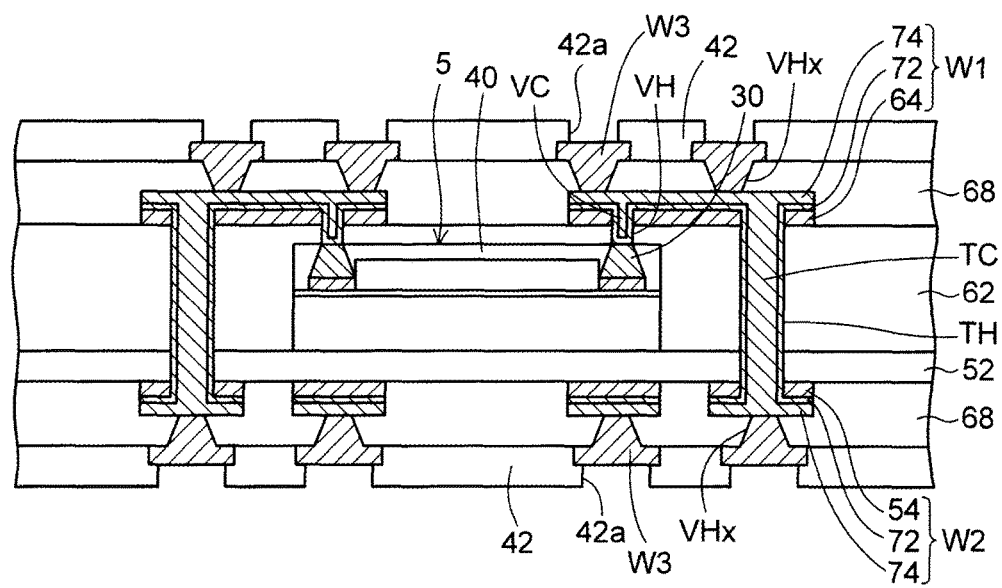
FIG. 11 is a sectional view showing an example where a multilayer wiring board is produced by using the battery built-in board of FIG. 10 as a base.

As shown in FIG. 11, a multilayer wiring board may be constructed in such a way that buildup wirings are formed on both sides of the battery built-in board 1 of FIG. 10 described above as a base.

In FIG. 11, a third insulation layer 68 is, respectively, formed on both sides of the insulation board 6 of FIG. 9C. The third insulation layer 68 is provided with a via hole VHx reaching the first wiring layer W1 and the second wiring layer W2.

Further, at both sides, a third wiring layer W3 is, respectively, formed on the third insulation layers 68. The third wiring layer W3 is connected to the first wiring layer W1 and the second wiring layer W2 through the via hole VHx.

Further, the solder resist layer 42 where the opening portion 42a is provided on the third wiring layer W3 is formed on the third insulation layers 68 at both sides, respectively. The number of layers of the build-up wirings formed can be arbitrarily set.

Figure 12:
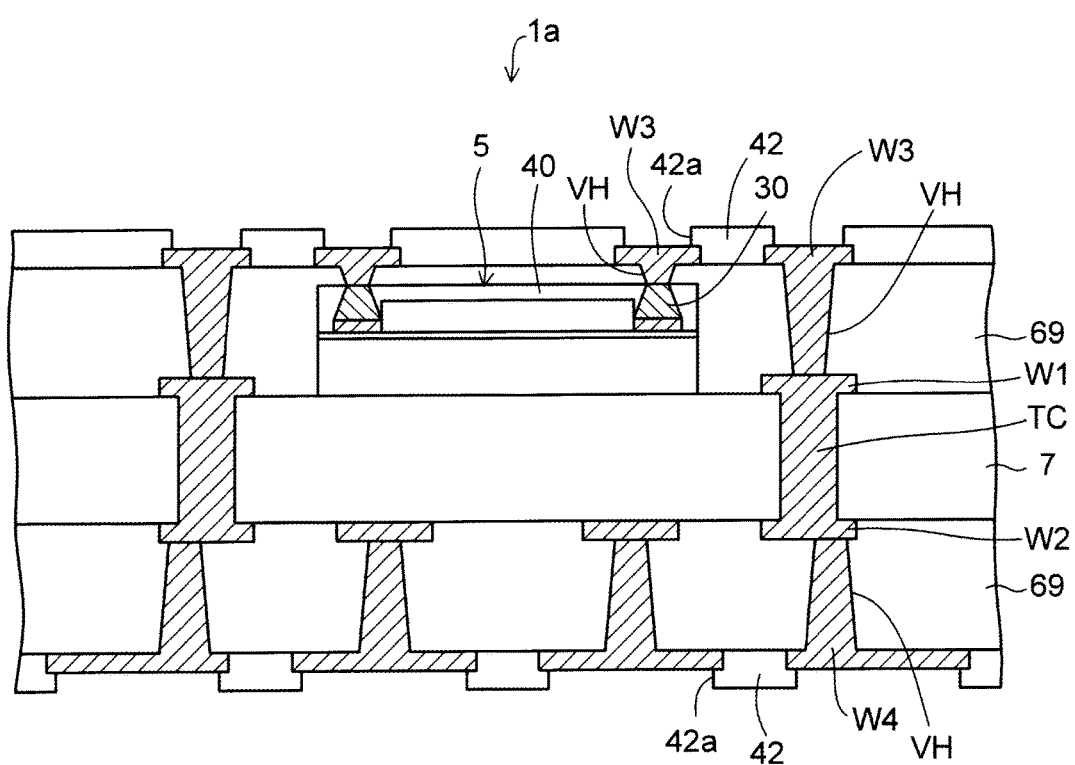
FIG. 12 is a sectional view showing a battery built-in board according to other exemplary embodiments.

In addition, FIG. 12 shows a battery built-in board 1a of other exemplary embodiments. As shown in FIG. 12, in the battery built-in board 1a of other exemplary embodiments, the secondary battery component 5 of FIG. 3C described above is arranged on a core board 7 made of an insulation layer and the like, such as glass epoxy resin.

The first wiring layer W1 and the second wiring layer W2 are formed on both sides of the core board 7. The first and second wiring layers W1, W2 on both sides are connected to each other via the through conductor TC formed in the core board 7.

An insulation layer 69 is formed on both sides of the core board 7, respectively. Further, the secondary battery component 5 is embedded in the insulation layer 69. The via holes VH are formed in the insulation layer 69 on the upper surface side of the core board 7. The via holes VH reach the first wiring layer W1 and the connection electrode 30 of the secondary battery component 5, respectively Further, the third wiring layer W3 is formed on the insulation layer 69 on the upper surface side of the core board 7. The third wiring layer W3 is connected to the first wiring layer W1 and the connection electrode 30 of the secondary battery component 5 through the via hole VH, respectively. The third wiring layer W3 is formed by a semi-additive process.

Further, the via hole VH is formed in the insulation layer 69 on the lower surface side of the core board 7. The via hole VH reaches the second wiring layer W2. Also, a fourth wiring layer W4 is formed on the insulation layer 69 at the lower surface side of the core board 7. The fourth wiring layer W4 is connected to the second wiring layer W2 through the via hole VH.

In addition, the solder resist layer 42 where the opening portions 42a are provided on each connection portion of the third wiring layer W3 and the fourth wiring layer W4 is formed on the insulation layer 69 at both sides, respectively. The number of the wiring layers formed on both sides of the core board 7 can be arbitrarily set. Further, the secondary battery component 5 may be embedded in any interlayer insulation layer of the build-up wiring layers formed on both sides of the core board 7.

Figure 13:
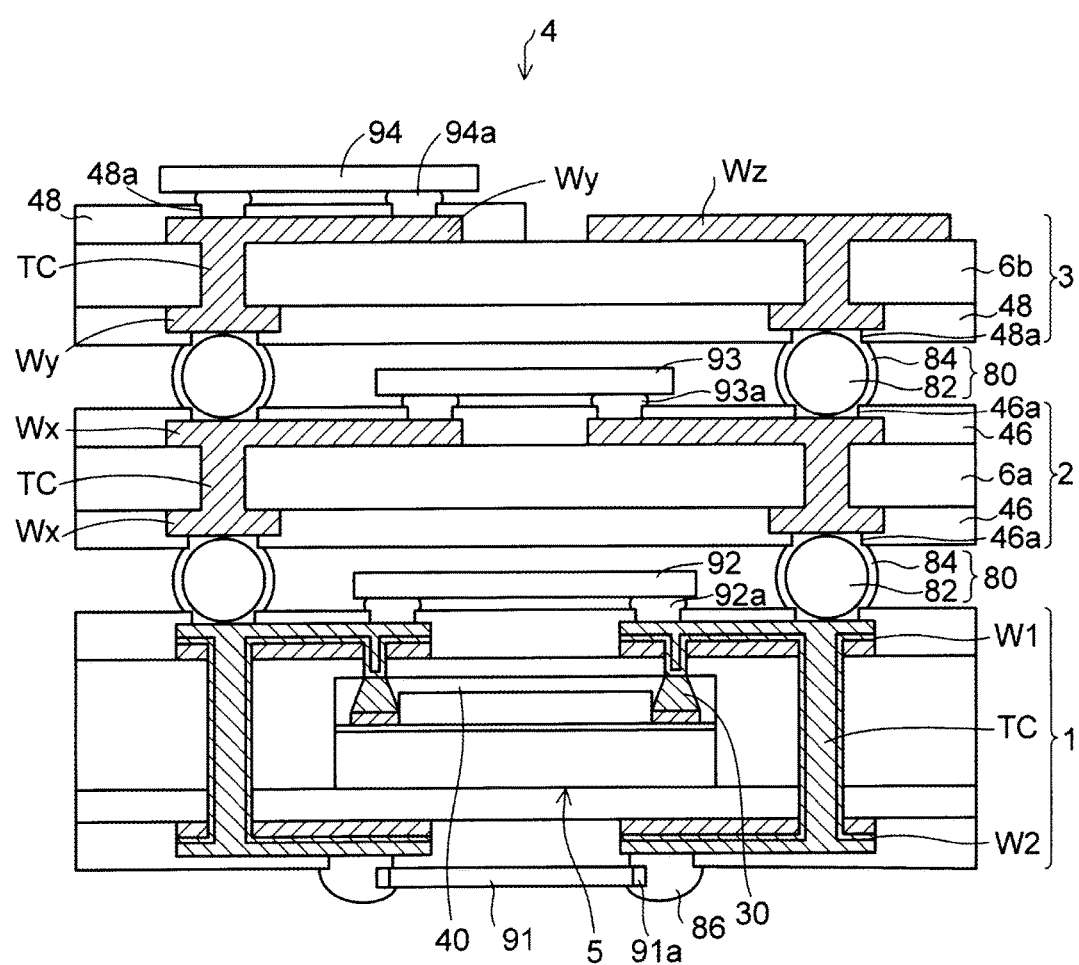
FIG. 13 is a sectional view showing an electronic component device using the battery built-in board of FIG. 10.

Next, an example of an electronic component device using the battery built-in board 1 where the secondary battery component 5 of FIG. 10 is incorporated will be described. As shown in FIG. 13, the battery built-in board 1 of FIG. 10 described above is prepared. A terminal 91a of a first electronic component 91 is connected to a connection portion of the second wiring layer W2 on the lower side of the battery built-in board 1 by a solder layer 86. The first electronic component 91 is, for example, a generator such as a photovoltaic device, a thermoelectric generator or a vibration generator. The first electronic component 91 supplies power to the secondary battery component 5 incorporated in the battery built-in board 1.

Further, a second electronic component 92 is flip-chip connected to a connection portion of the first wiring layer W1 on the upper surface of the battery built-in board 1 through a bump electrode 92a. The second electronic component 92 is, for example, a power management IC and manages the power of the secondary battery component 5.

In FIG. 13, the first electronic component 91 and the second electronic component 92 are connected to both sides of the battery built-in board 1, respectively. However, a required electronic component may be connected to at least one of the first wiring layer W1 and the second wiring layer W2 at both sides of the battery built-in board 1. Alternatively, only the secondary battery component 5 may be incorporated in the battery built-in board 1 and power may be supplied from other wiring boards.

Further, an intermediate wiring board 2 is prepared. In the intermediate wiring board 2, a wiring layer Wx is formed on both sides of an insulation board 6a, respectively. The wiring layers Wx on the both sides are connected to each other through the through conductor TC formed in the insulation board 6a.

A solder resist layer 46 where an opening portion 46a is provided on a connection portion of the wiring layer Wx is formed on both sides of the insulation board 6a, respectively. Further, a third electronic component 93 is flip-chip connected to the connection portion of the wiring layer Wx on the upper surface of the insulation board 6a through a bump electrode 93a. For example, the third electronic component 93 is a semiconductor chip such as a CPU.

Further, the intermediate wiring board 2 is placed on the battery built-in board 1. The first wiring layer W1 on the upper side of the battery built-in board 1 and the wiring layer Wx on the lower side of the intermediate wiring board 2 are connected to each other by solder balls 80. The solder ball 80 is formed by covering a solder layer 84 on an outer surface of a copper ball 82. Alternatively, the solder ball 80 may be formed by covering a solder layer on an outer surface of a resin ball or may be entirely formed from the solder.

Furthermore, an upper wiring board 3 is prepared. In the upper wiring board 3, a wiring layer Wy is formed on both sides of an insulation board 6b, respectively. The wiring layers Wy on both sides are connected to each other through the through conductor TC formed in the insulation board 6b.

A solder resist layer 48 where an opening portion 48a is provided on a connection portion of the wiring layer Wy is formed on both sides of the insulation board 6b, respectively. Further, a fourth electronic component 94 is flip-chip connected to the connection portion of the wiring layer Wy on the upper side of the insulation board 6b through a bump electrode 94a. For example, the fourth electronic component 94 is a sensor.

In addition, the upper wiring board 3 is arranged on the intermediate wiring board 2. The first wiring layer Wx on the upper side of the intermediate wiring board 2 and the wiring layer Wy on the lower side of the upper wiring board 3 are connected to each other by the solder ball 80.

Further, a wiring pattern Wz having a predetermined shape is exposed to the upper surface of the upper wiring board 3. For example, the wiring pattern Wz is an antenna for wireless communication.

Thereby, the electronic component device 4 using the battery built-in board 1 of FIG. 10 is constructed.

The second to fourth electronic components 92, 93, 94 of the electronic component device 4 according to the exemplary embodiment are operated by power supplied from the secondary battery component 5 incorporated in the battery built-in board 1.

Further, the secondary battery component 5 is charged by power generated by the first electronic component 91 (generator) mounted on the battery built-in board 1. In this way, the secondary battery component 5 is charged and discharged by the operation of the electronic component device 4.

In FIG. 13, a sealing resin may be filled between the battery built-in board 1 and the intermediate wiring board 2, between the intermediate wiring board 2 and the upper wiring board 3, and below the first to fourth electronic components 91, 92, 93, 94.

CLAUSES

This disclosure further encompasses various exemplary embodiments, for example, described below.

1. A method for manufacturing a battery built-in board, comprising:

preparing a battery component comprising a battery and an insulation part covering the battery;

placing the battery component on a first insulation layer in a state where the insulation part faces upward; and forming a second insulation layer covering the battery component on the first insulation layer, wherein rigidity of the insulation part is lower than that of the first insulation layer and the second insulation layer.

2. The manufacturing method of the battery built-in board according to claim 1, wherein the battery is a secondary battery.

3. The manufacturing method of the battery built-in board according to claim 1, wherein, in the preparing the battery component, the battery component has an electrode exposed from the upper surface of the insulation part, and the manufacturing method comprises after the forming the second insulation layer, forming a via hole in the second insulation layer on the electrode of the battery component; and forming a first wiring layer on the second insulation layer, the first wiring layer being connected to the electrode of the battery component through a via conductor in the via hole.

4. The manufacturing method of the battery built-in board according to claim 3, wherein, in the forming the via hole, through holes are simultaneously formed through the first insulation layer and the second insulation layer, and the forming the first wiring layer comprises forming a second wiring layer on the lower surface of the first insulation layer, the second wiring layer being connected to the first wiring layer through a through conductor formed in the through hole.

5. The manufacturing method of the battery built-in board according to claim 3, wherein the preparing the battery component comprises:

forming a metal bump in a connection portion of the battery;

forming the insulation part on the battery so that a leading end side of the metal bump protrudes from the insulation part; and obtaining the electrode by removing the leading end side of the metal bump.

6. The manufacturing method of the battery built-in board according to claim 4, comprising:

after the forming the first wiring layer and the second wiring layer, connecting an electronic component to at least one of the first wiring layer and the second wiring layer.

What is claimed is:

1. A battery built-in board comprising:
a battery component comprising a battery and an insulation part covering the battery;
an insulation layer covering the battery component; and
a wiring layer formed on an upper surface of the insulation layer,
wherein rigidity of the insulation part is lower than that of the insulation layer,
wherein the battery comprises:
  a plus electrode;
  a minus electrode;
  a cathode connected to the plus electrode;
  an anode connected to the minus electrode;
  an electrolyte layer provided between the anode and cathode;
  a protective layer covering the cathode, the anode, and the electrolyte layer; and
  a substrate on which the plus electrode, the minus electrode, the cathode, the anode, the electrolyte layer, and the protective layer are formed,
wherein the battery component further comprises:
  a first connection electrode connected to the plus electrode; and
  a second connection electrode connected to the minus electrode,
wherein the insulation part is formed on the protective layer, the first connection electrode, the second connection electrode, the plus electrode, the minus electrode, the cathode, the anode, the electrolyte layer, and the protective layer are embedded in the insulation part with an upper surface of the first connection electrode and an upper surface of the second connection electrode exposed from the insulation part,
wherein a first via hole and a second via hole are formed in the insulation layer, the first via hole communicating with the upper surface of the first connection electrode, and the second via hole communicating with the upper surface of the second connection electrode, and
wherein a first via conductor is provided in the first via hole and connects the wiring layer to the first connection electrode, and a second via conductor is provided in the second via hole and connects the wiring layer to the second connection electrode.

2. The battery built-in board according to claim 1, wherein the battery is a secondary battery.

3. A battery built-in board comprising:
a battery component comprising a battery including an electrolyte layer, a connection electrode, and an insulation part, wherein the battery, the electrolyte layer of the battery, and the connection electrode are embedded in the insulation part with an upper surface of the connection electrode exposed from the insulation part;
an insulation layer comprising a first insulation layer on which the battery component is placed, and a second insulation layer formed on the first insulation layer and covering the battery component, wherein a via hole is formed in the second insulation layer, the via hole communicating with the upper surface of the connection electrode; and
a first wiring layer formed on the second insulation layer and connected to the connection electrode through a via conductor in the via hole,
wherein rigidity of the insulation part is lower than that of the insulation layer.

4. The battery built-in board according to claim 3, wherein an upper surface of the insulation part is flush with the upper surface of the connection electrode.

5. The battery built-in board according to claim 3, comprising:
a second wiring layer formed on a lower surface of the first insulation layer, the lower surface opposite to a surface on which the battery component is placed; and
a through hole formed through the first insulation layer and the second insulation layer,
wherein the first wiring layer and the second wiring layer are connected to each other through a through conductor formed in the through hole.

6. The battery built-in board according to claim 5, comprising:
an electronic component connected to at least one of the first wiring layer and the second wiring layer.

7. The battery built-in board according to claim 1, wherein a tensile strength of the insulation layer is 70 MPa to 100 MPa and, a tensile strength of the insulation part is 0.5 MPa to 10 MPa.

8. The battery built-in board according to claim 3, wherein the battery is a secondary battery.

9. The battery built-in board according to claim 3, wherein a tensile strength of the insulation layer is 70 MPa to 100 MPa and, a tensile strength of the insulation part is 0.5 MPa to 10 MPa.

10. The battery built-in board according to claim 3, wherein the battery comprises: a cathode; an anode; the electrolyte layer provided between the anode and cathode; a protective layer covering the cathode, the anode, and the electrolyte layer; and a substrate on which the cathode, the anode, the electrolyte layer, and the protective layer are formed,
wherein the insulation part is formed on the protective layer.

11. The battery built-in board according to claim 4, wherein the battery comprises: a cathode; an anode; the electrolyte layer provided between the anode and cathode; a protective layer covering the cathode, the anode, and the electrolyte layer; and a substrate on which the cathode, the anode, the electrolyte layer, and the protective layer are formed, and wherein the insulation part is formed on the protective layer.

12. The battery built-in board according to claim 5, wherein the battery comprises: a cathode; an anode; the electrolyte layer provided between the anode and cathode; a protective layer covering the cathode, the anode, and the electrolyte layer; and a substrate on which the cathode, the anode, the electrolyte layer, and the protective layer are formed, and wherein the insulation part is formed on the protective layer.

13. The battery built-in board according to claim 5, wherein an upper surface of the insulation part is flush with the upper surface of the connection electrode.

14. The battery built-in board according to claim 13, wherein the battery comprises: a cathode; an anode; the electrolyte layer provided between the anode and cathode; a protective layer covering the cathode, the anode, and the electrolyte layer; and a substrate on which the cathode, the anode, the electrolyte layer, and the protective layer are formed, and wherein the insulation part is formed on the protective layer.

* * * * *